(12) United States Patent
Fenollosa et al.

(10) Patent No.: US 10,967,434 B2
(45) Date of Patent: Apr. 6, 2021

(54) BORING HEAD WITH AN ELECTRONIC UNIT

(71) Applicant: Big Kaiser Präzisionswerkzeuge AG, Rümlang (CH)

(72) Inventors: Jose Maria Fenollosa, Hünenberg (CH); Ralph Stadelmann, Bülach (CH)

(73) Assignee: Big Kaiser Präzisionswerkzeuge AG

( * ) Notice: Subject to any disclaimer, the term of this patent is extended or adjusted under 35 U.S.C. 154(b) by 0 days.

(21) Appl. No.: 16/324,705

(22) PCT Filed: Aug. 10, 2017

(86) PCT No.: PCT/EP2017/070351
§ 371 (c)(1),
(2) Date: Feb. 11, 2019

(87) PCT Pub. No.: WO2018/029308
PCT Pub. Date: Feb. 15, 2018

(65) Prior Publication Data
US 2019/0176243 A1    Jun. 13, 2019

(30) Foreign Application Priority Data

Aug. 12, 2016  (EP) ..................................... 16183907

(51) Int. Cl.
*B23B 29/034* (2006.01)
*H03K 17/96* (2006.01)
*H03K 17/965* (2006.01)

(52) U.S. Cl.
CPC .. *B23B 29/03403* (2013.01); *B23B 29/03407* (2013.01); *H03K 17/964* (2013.01);
(Continued)

(58) Field of Classification Search
CPC ...... B23B 29/034093; B23B 29/03407; B23B 2260/108; B23B 2260/128; H03K 17/965; H03K 17/964
See application file for complete search history.

(56) References Cited

U.S. PATENT DOCUMENTS 4,676,127 A   6/1987  Watanabe
4,761,101 A   8/1988  Zettl
(Continued)

FOREIGN PATENT DOCUMENTS

AU       2015101837 A4   2/2016
CN        201387529 Y    1/2010
(Continued)

OTHER PUBLICATIONS

Extended European Search Report including Written Opinion for EP16188116.4 dated Jan. 5, 2018.
(Continued)

*Primary Examiner* — Eric A. Gates
*Assistant Examiner* — Paul M Janeski
(74) *Attorney, Agent, or Firm* — Lerner, David, Littenberg, Krumholz & Mentlik, LLP

(57) ABSTRACT

A boring head (1) with an electronic unit (20) integrated in the boring head (1) is provided, the electronic unit (20) comprising a control unit (60), a display (30) and a compartment (26) for a power source (41). The display (30) is connected to the control unit (60) and serves to display information concerning the status of the boring head (1) to a user. The compartment (26) serves to accommodate a power source (41) to supply the control unit (60) and the display (30) with electric power. The electronic unit (20) as a whole is designed as a compact subassembly of the boring head (1).

12 Claims, 8 Drawing Sheets

(52) U.S. Cl.
CPC ...... *H03K 17/965* (2013.01); *B23B 2260/108* (2013.01); *B23B 2260/128* (2013.01)

(56) References Cited

U.S. PATENT DOCUMENTS

| | | | |
|---|---|---|---|
| 5,251,511 | A | 10/1993 | Muendlein et al. |
| 6,422,012 | B1 | 7/2002 | Bassett |
| 7,883,303 | B2 | 2/2011 | Tang et al. |
| 2003/0103827 | A1 | 6/2003 | Moller et al. |
| 2006/0085092 | A1 | 4/2006 | Redecker et al. |
| 2008/0062013 | A1 | 3/2008 | Face et al. |
| 2009/0267429 | A1 | 10/2009 | Moller et al. |
| 2009/0280743 | A1 | 11/2009 | Gast et al. |
| 2012/0034040 | A1 | 2/2012 | Frank et al. |
| 2012/0205880 | A1 | 8/2012 | Fronius et al. |
| 2012/0269590 | A1 | 10/2012 | Buck |
| 2013/0322889 | A1 | 12/2013 | Graf |
| 2014/0140781 | A1 | 5/2014 | Sjoo et al. |
| 2014/0212236 | A1 | 7/2014 | Veittinger |
| 2015/0116158 | A1 | 4/2015 | Alrabadi et al. |
| 2015/0116159 | A1 | 4/2015 | Chen et al. |

FOREIGN PATENT DOCUMENTS

| | | |
|---|---|---|
| DE | 4332927 A1 | 3/1995 |
| DE | 19711431 C1 | 11/1998 |
| DE | 10007126 A1 | 9/2001 |
| DE | 20301325 U1 | 5/2003 |
| DE | 102004051145 A1 | 4/2006 |
| DE | 102009017094 A1 | 10/2010 |
| DE | 102013201328 A1 | 7/2014 |
| DE | 102013217911 A1 | 3/2015 |
| DE | 102014101932 B3 | 7/2015 |
| EP | 0229399 A2 | 7/1987 |
| EP | 0491724 B1 | 1/1994 |
| EP | 1286413 A1 | 2/2003 |
| EP | 1762331 B1 | 12/2008 |
| EP | 2116324 A1 | 11/2009 |
| EP | 2735400 A1 | 5/2014 |
| EP | 2618425 B1 | 6/2014 |
| EP | 1758710 B2 | 9/2014 |
| EP | 2552641 B1 | 12/2014 |
| EP | 2683525 B1 | 12/2014 |
| EP | 3018825 A1 | 5/2016 |
| FR | 2389238 A1 | 11/1978 |
| GB | 2295486 A | 5/1996 |
| KR | 20090122588 A | 12/2009 |
| WO | 2006000746 A1 | 1/2006 |
| WO | 2009117396 A2 | 9/2009 |
| WO | 2015125119 A1 | 8/2015 |

OTHER PUBLICATIONS

International Search Report for PCT/EP2017/070351, published as WO2018/029308, dated Nov. 8, 2017.

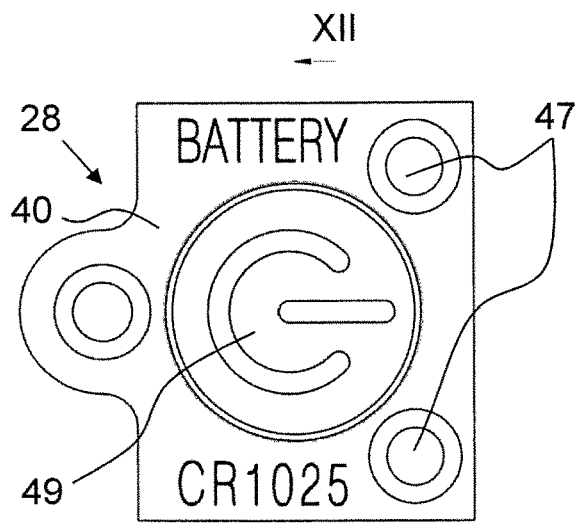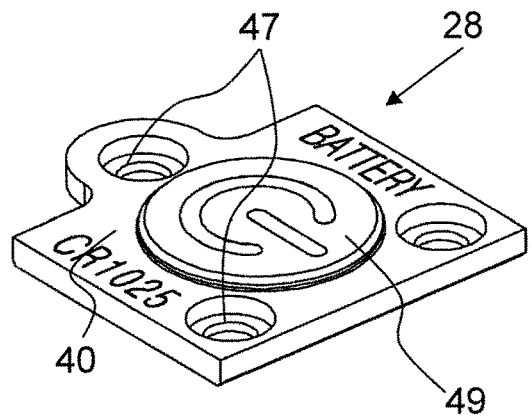
FIG. 9              FIG. 10
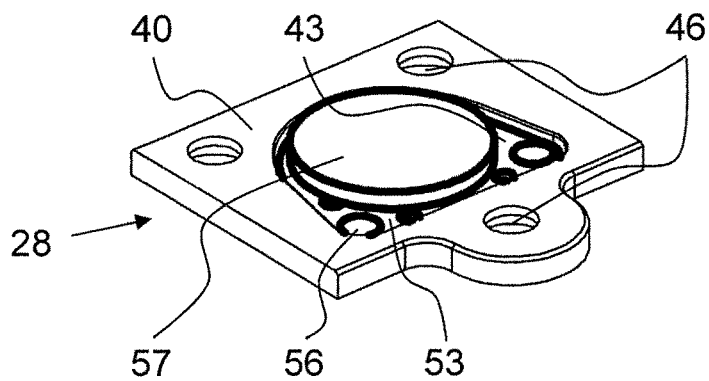
FIG. 11
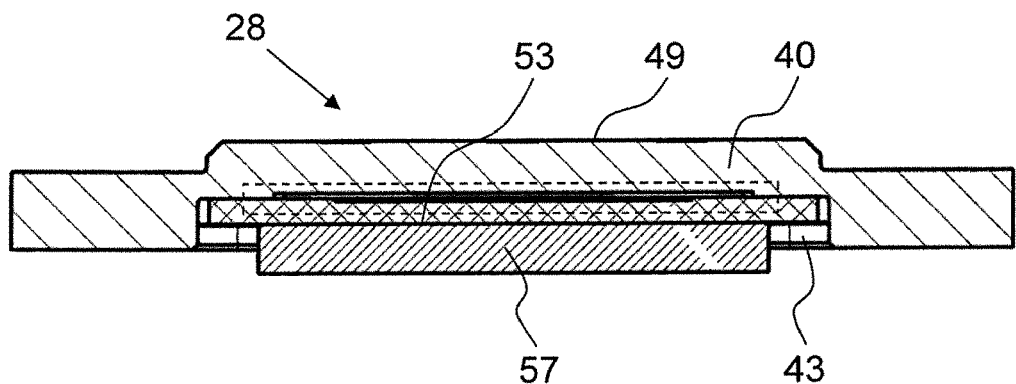
FIG. 12

BORING HEAD WITH AN ELECTRONIC UNIT

CROSS-REFERENCE TO RELATED APPLICATIONS

This application is a national phase entry under 35 U.S.C. § 371 of International Application No. PCT/EP2017/070351, filed on Aug. 10, 2017, published in English, which claims priority to European Patent Application No. 16183907.1, filed on Aug. 12, 2016, the disclosures of which are hereby incorporated herein by reference.

TECHNICAL FIELD

The present invention relates to a boring head with an electronic unit and to an electronic unit of such a boring head. In particular, the invention relates to a boring head holding a cutting insert where the boring head is adapted to transfer a rotational movement from a driving source in a machine tool to the cutting insert which may in particular be designed for chip forming metal cutting.

PRIOR ART

Boring heads which are used for example for chip forming metal cutting often comprise a radially displaceable insert holder, in order to allow a radial adjustment of the cutting edge of the cutting insert. The extent of radial displacement of the cutting insert represents a crucial parameter of the boring head and is usually indicated to the user by means of a scale being provided on an adjusting screw by means of which the insert holder can be radially displaced.

In high-precision tooling and for offering a better comfort to the user, it is often desired to digitally indicate the radial displacement of the cutting insert, along with other possible status data of the boring head, by means of a display. For this purpose, a display, such as a liquid-crystal display (LCD), can be provided, in addition or as an alternative to an adjusting screw with a scale.

In WO 2006/000746, a display is arranged on an adjuster tool for manually adjusting the position of a cutting edge. Thus, the display is not arranged directly on the boring head, but on a separate device.

A boring head comprising an integrated display for indicating the actual radial displacement of a cutting insert is disclosed by DE 10 2013 217 911 A1.

The provision of a display in a boring head usually results in a complicated and expensive construction of the boring head, because not only a sensor for measuring the displacement of the insert holder needs to be provided additionally, but also a control unit as well as some sort of an electric power source, in order to control the display and to supply electric power to the display and to the control unit. All of these electric components which together form an electronic unit need to be positioned somehow within the limited space of the boring head and need to be connected with each other internally.

Moreover, due to the usually high rotational velocities, the plurality of electric components and the electric lines used for connecting these components are exposed to high centrifugal forces during operation of the boring head. There is a high risk of dirt particles and cooling liquid entering the boring head at one of the plurality of covers that enable access to these electric components and lines. As a consequence, the provision of an electronic unit increases the risk of failure of one of the components in the boring heads of the prior art.

SUMMARY OF THE INVENTION

It is an object of the present invention to provide a boring head with an electronic unit, which has a simple construction and a reduced risk of failure.

In the following, all indications of positions and directions, such as above, under, in- and outwardly are related to the radial direction of the boring head being directed perpendicular to the rotation axis as defined by the usual direction of rotation of the boring head in normal use, i.e. when machining a work piece. The front side of an element of the boring head usually means the side of the element which is directed radially outwardly and, thus, can represent a visible element to the user. The backside usually is the side of the element which is directed radially inwardly.

In order to achieve this object, the present invention provides a boring head with an electronic unit integrated in the boring head, the electronic unit comprising
  a control unit,
  a display being connected to the control unit, for displaying information concerning the status of the boring head to a user, and
  a compartment for a power source to supply the control unit and the display with electric power.

The electronic unit as a whole is designed as a compact subassembly of the boring head.

The boring head is adapted to transfer a rotational movement from a driving source, e.g. a spindle in a machine tool, to e.g. a cutting insert for machining a work piece. The cutting insert can particularly be adapted for chip forming metal cutting. The boring head usually comprises a main body to which the electronic unit is attached and which preferably comprises a stem portion and a head portion. The stem portion is preferably essentially cylindrical, but can also be cone-shaped or have a polygonal cross-section. The head portion is preferably essentially cylindrical. The stem portion usually serves to connect the boring head to a driving source e.g. a spindle in a machine tool. Attached to the head portion are usually the cutting insert for machining a work piece and preferably also the electronic unit. The electronic unit forms an integral part of the boring head and is usually arranged completely inwardly of the cutting insert, at least of the radially outermost edge of the cutting insert.

Being designed as a compact subassembly in respect to the electronic unit means that the electronic unit represents a module-like component that is clearly delimited from the rest of the boring head. Thus, the electronic unit as a whole forms a separate and clearly delimited structural component with respect to the other components of the boring head.

The different components of the electronic unit, i.e. at least the control unit, the display and the compartment for the power source, are usually arranged closely together and all electric lines that interconnect these different components preferably extend within the electronic unit and not through other parts of the boring head. Optionally, the electronic unit can be non-destructively detachable as a whole from the boring head by means of only a few simple manipulations, such as by loosening some screws, and in such a way, that the electronic unit forms a single, compact piece after having been detached from the boring head.

Due to its compact construction in the form of a subassembly, the electronic unit can be produced completely separately from the rest of the boring head. Since all electric lines for interconnecting the components of the electronic unit preferably completely extend within the electronic unit, the number of electric cables being present within the boring head can be reduced significantly. Advantageously, in order to further reduce the risk of failure, the electronic unit does not comprise any electric cables at all, but only electric connections in the form of contacts, printed circuits etc. Due to the compact construction of the electronic unit, the boring head can optionally be constructed such that the electronic unit can easily be detached from the main body, for example for cleaning purposes or for replacement. Furthermore, an electronic unit with a compact construction can be sealed optimally with respect to dirt particles and liquid. Thus, the boring head also has a reduced risk of failure.

Usually, the control unit is connected to some type of sensor that serves to measure a parameter of the boring head. The sensor can, but does not have to be part of the electronic unit. The parameter is preferably the radial position of the cutting insert being attached to the boring head. The control unit is preferably adapted to process the input data received from the sensor to an output signal that serves as the input signal for the display to indicate a respective value. For this purpose, the control unit usually comprises at least an analog-digital converter or a serial communication port such as a Universal Asynchronous Receiver Transmitter (UART), a serial peripheral interface (SPI) or an inter-integrated circuit ($I^2C$). The display preferably comprises a liquid-crystal display (LCD) or a DOT Matrix or a TFT or E-Paper.

The power source is preferably represented by a customary battery. In a particularly preferred embodiment, the compartment is adapted to accommodate a button battery, which is particularly space-saving. Within the compartment, respective contact elements are usually provided, in order to electrically connect the power source to the control unit and to the display.

Preferably, the electronic unit also comprises at least one button being operatively connected to the control unit, in order to enable the user to influence the control unit. The button which is advantageously designed as a push-button preferably serves to switch on and off the electronic unit and particularly the display. Depending on e.g. the order or duration of its operation, the button can provide further functionalities, such as for example a reset-function.

A particularly space-saving arrangement can be achieved, if the compartment for the power source is arranged between the control unit and the button.

Usually, a cover is provided for covering the compartment for the power source. The cover is preferably removably attached to the boring head, for example by means of screws, such that the power source can easily be replaced when needed. If the electronic unit also comprises a button, then the button is preferably formed by the cover of the compartment. Such a design of the electronic unit is particularly space-saving.

The principle of function of the button is preferably based on a piezo element. The piezo element is adapted to detect a manipulation of the button by the user. By the provision of a piezo element, smallest movements of the button, which can even be in the micrometer-range, can usually be detected. With such a button, a particularly tight sealing of the boring head can be achieved. The piezo element is advantageously arranged between the compartment for the power source and the cover that forms the button.

Preferably, the piezo element is formed as a piezo diaphragm. In a particularly preferred embodiment, the piezo diaphragm is connected to the control unit by means of an anisotropic conductive adhesive. The electronic unit can also comprise a piezo board to which the piezo diaphragm is attached and connected by means of the anisotropic conductive adhesive. The anisotropic conductive adhesive is preferably an adhesive, such as a glue, which per se is electrically non-conducting, but in which electrically conductive particles are embedded. When pressing together the two components to be attached to one another, i.e. the piezo diaphragm and the piezo board, optionally under the influence of temperature (thermocompressing), the anisotropic conductive adhesive being arranged in-between is compressed such that at least some of the conductive particles get into contact with both components or that electrically conductive bridges between the two components are formed by the conductive particles. By using an anisotropic conductive adhesive for connecting the piezo diaphragm to the control unit and in particular to the piezo board, a particularly firm and space-saving connection of the piezo diaphragm can be achieved.

It is noted that the principle of connecting a piezo diaphragm to a control unit or to a connecting element and in particular to a PCB by means of an anisotropic conductive adhesive could basically also be applied in other boring heads. The respective boring heads which are suited for the application of this principle usually have a piezo-button, but do not necessarily need to comprise a display or an electronic unit with a compact construction. Thus, the principle of connecting a piezo diaphragm to a control unit or to a connecting element by means of an anisotropic conductive adhesive represents another independent invention.

The piezo board can have the form of a printed circuit board. Preferably, the piezo board is arranged between the compartment for the power source and the piezo element.

In a particularly preferred embodiment, the boring head comprises a radially displaceable insert holder and a sensor for measuring the radial displacement of the insert holder. The sensor is preferably connected to the control unit, and the control unit is adapted to control the display such, that the radial displacement of the insert holder is indicated by the display.

The electronic unit advantageously comprises a casing in or on which the control unit, the display, the compartment for the power source, and preferably also the button are arranged. By providing such a casing, a particularly compact electronic unit can be achieved that can be produced separately from rest of the boring head. Thus, in such an embodiment, the casing, together with the control unit, the display, the compartment for the power source, and preferably also with the button, forms a separate subassembly of the boring head which can be attached to the main body for example by means of only a few fixing screws.

The control unit is preferably provided as a printed circuit board (PCB). The PCB advantageously comprises a signal processing unit and/or a memory chip.

The PCB advantageously forms a side wall of the electronic unit. It can particularly form the backside, i.e. the backside wall, of the electronic unit.

In a preferred embodiment, the PCB and the casing together form an inner space of the electronic unit, in which inner space the display and the compartment for the power source are arranged, in particular completely arranged. The electronic elements of the button, e.g. the piezo element, are preferably also arranged in this inner space.

The electronic unit is preferably adapted for wireless communication with an external device, such as a computer or a mobile phone. The electronic unit can particularly be adapted for wireless communication according to the "Bluetooth Low Energy"-standard. For wirelessly transmitting data from the control unit to an external device, the electronic unit preferably comprises an antenna. Advantageously, a window of the casing of the electronic unit is used to transmit the antenna radiation to the outside. Thus, the antenna is adapted to radiate electromagnetic waves through the window of the casing. The window is preferably a display window which allows the user to see the display. Advantageously, the antenna comprises a radiofrequency (RF) ground plane integrated in the PCB and a conductive element being formed by the casing of the electronic unit. The ground plane and the conductive element form the two legs of the antenna. The ground plane is advantageously arranged directly on the backside of the display window. In an alternative, but also preferred embodiment, the entire antenna can be integrated in the PCB. In such a case, the antenna is advantageously arranged directly on the backside of the display window, such that electromagnetic waves can be radiated from the antenna through the display window to the outside.

The main body preferably comprises a recess which is preferably open in the radial direction. The electronic unit is advantageously arranged within this recess. The recess is preferably provided in the head portion, in particular within an essentially cylindrical side wall of the head portion.

BRIEF DESCRIPTION OF THE DRAWINGS

Preferred embodiments of the invention are described in the following with reference to the drawings, which are for the purpose of illustrating the present preferred embodiment of the invention and not for the purpose of limiting the same. In the drawings.

FIG. 9 shows a plan view on the front of the battery cover of the electronic unit of the boring head of FIG. 1;

FIG. 10 shows a perspective front view of the battery cover of the electronic unit of the boring head of FIG. 1;

FIG. 11 shows a perspective back view of the battery cover of the electronic unit of the boring head of FIG. 1;

FIG. 12 shows a cross-sectional view of the battery cover of the electronic unit of the boring head of FIG. 1;

DESCRIPTION OF PREFERRED EMBODIMENTS

In FIGS. 1 to 18, a preferred embodiment of an inventive boring head 1 or one or several parts thereof are shown.

Figure 1:
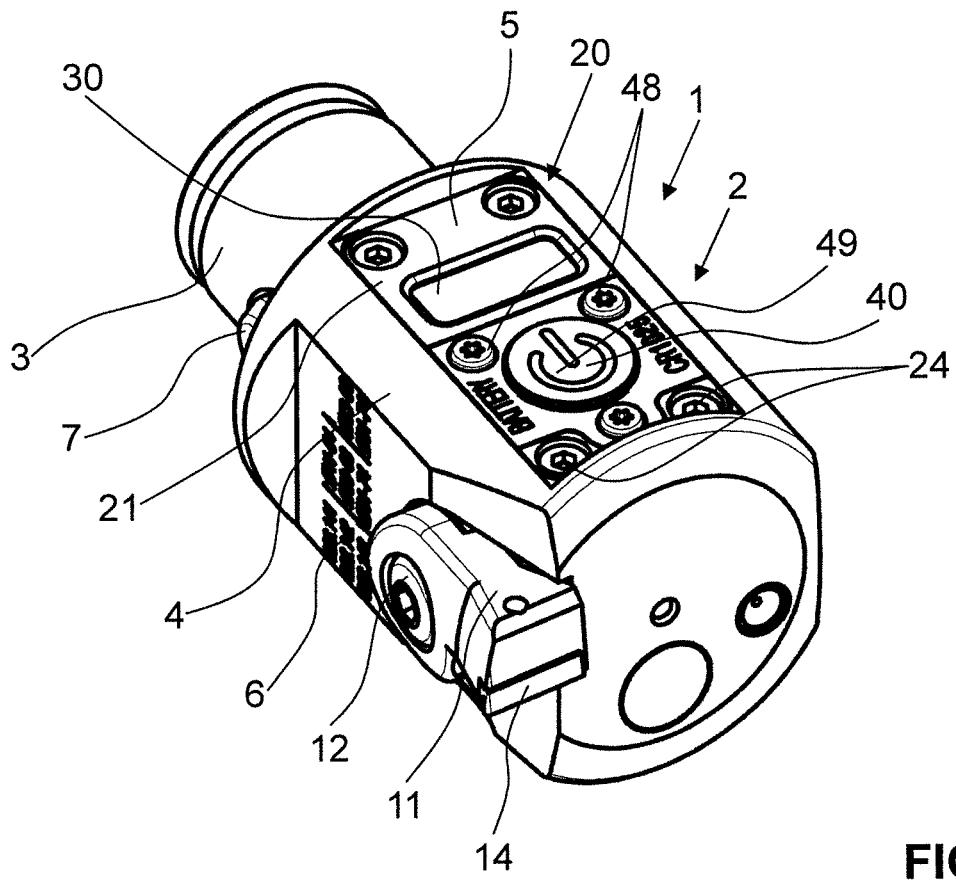
FIG. 1 shows a perspective view of a boring head according to an inventive embodiment.
Figure 2:
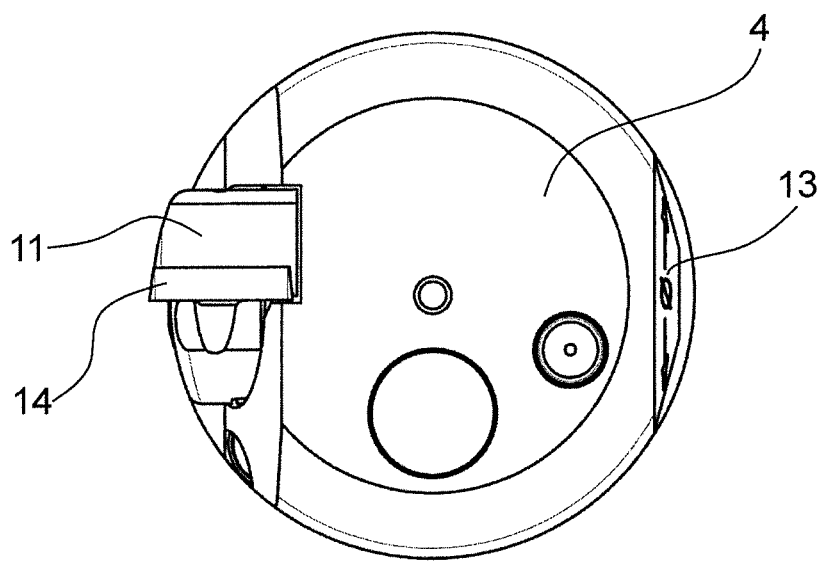
FIG. 2 shows a top view of the boring head of FIG. 1.

The boring head 1, as shown in FIG. 1, comprises a main body 2 being made as a whole in one piece. The main body 2 comprises a generally cylindrical stem portion 3 and an essentially cylindrical head portion 4. The stem portion 3 which has a smaller diameter than the head portion 4 serves to connect the boring head 1 to a driving source such as a spindle of a machine tool. In operation of the boring head 1, the driving source which is not shown in the figures effects a rotational movement of the boring head 1. For this purpose, the stem portion 3 is attached to the driving source in a torque-proof manner, such that the boring head 1 can transfer the rotational movement of the driving source to the cutting insert 14 which is adapted for chip faulting metal cutting, i.e. for acting directly on a work piece to be machined.

For securing the boring head 1 in a torque-proof manner on the driving source of a boring or milling machine, a bolt 7 is displaceably arranged in the stem portion 3. The bolt 7 extends transversely, i.e. radially, through the stem portion 3.

Due to the essentially cylindrical shapes of the stem portion 3 and the head portion 4, a central longitudinal axis and a radial direction of the boring head 1 are defined. The central longitudinal axis coincides with the rotational axis of the boring head 1 in normal use.

The head portion 4 of the boring head 1 comprises a transverse, i.e. radial, channel diametrically extending throughout the head portion 4. Within this channel, a tool carrier 10 in the form of a plunger is arranged (see FIG. 3). An insert holder 11 is attached to a first end-face of the tool carrier 10 outside of the channel. The insert holder 11 is attached to the tool carrier 10 by means of a clamping screw 12. The insert holder 11 holds a cutting insert 14 which has a cutting edge being adapted to directly act on a work piece for chip forming metal cutting. Along the radial direction, the cutting edge of the cutting insert 14 represents the outermost part of the boring head 1.

Attached to the second end-face of the tool carrier 10 is an adjusting screw 13 by which the tool carrier 10 can be displaced along the radial direction. The adjusting screw 13 has a hexagon socket for rotating the adjusting screw 13 by means of a corresponding hex key. Upon rotation of the adjusting screw 13, the tool carrier 10 is displaced along the radial direction. A scale can optionally be printed on the adjusting screw 13, in order to indicate the approximate displacement of the tool carrier 10 to the user.

On the head portion 4, an inscription 6 can be provided, in order to provide certain information to the user, such as for example information concerning different cutting inserts 14 and/or insert holders 11 that can be used in combination with this boring head 1.

On a side of the head portion 4 which is directed in a perpendicular direction relative to the longitudinal extension of the tool carrier 10, a recess 5 is provided. The recess 5 defines a cuboid and outwardly open inner space of the head portion 4. The inner space of recess 5 serves to accommodate an electronic unit 20.

The electronic unit 20 serves to calculate the actual radial displacement of the tool carrier 10 and to indicate a corresponding displacement value on a display 30 to the user. For this purpose, the electronic unit 20 comprises a battery compartment 26 for a customary battery 41, a display 30, a push-button 49 and a printed circuit board (PCB) 60. All of these electric components of the electronic unit 20 are interconnected with each other internally, such that the battery 41 can supply electric power to the PCB 60 and to the display 30 and that the user can influence the signal processing of the PCB 60 and thus the indication on the display 30 by pressing the push-button 49. The entire electronic unit 20 is integrated in the head portion 4 of the boring head 1.

Figure 3:
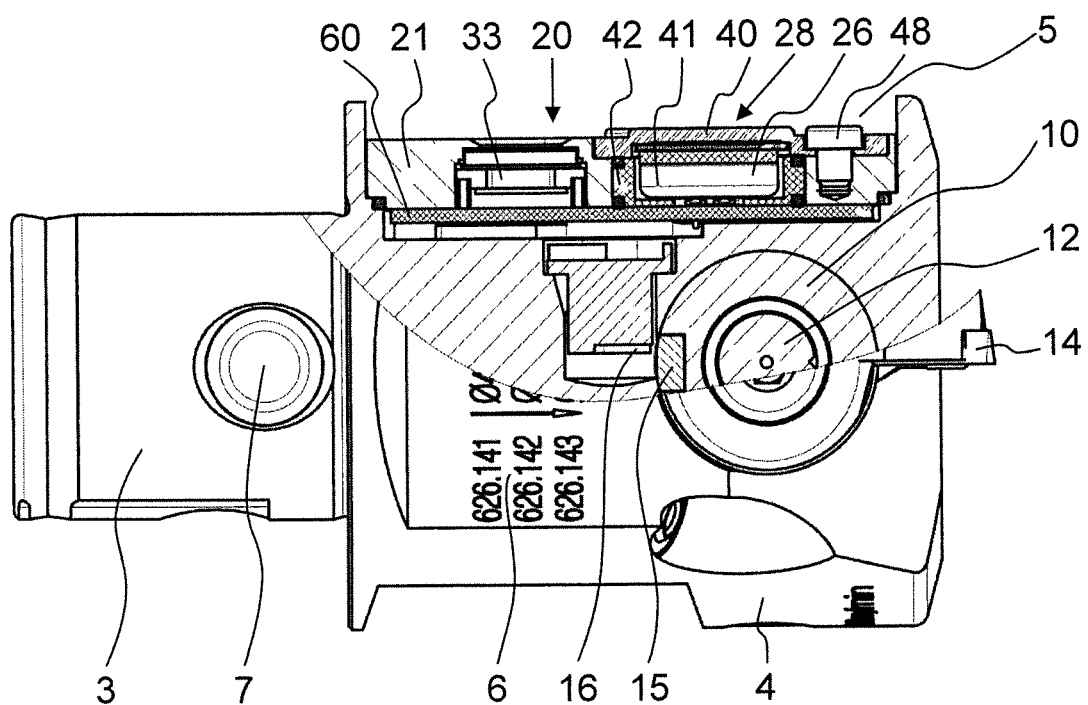
FIG. 3 shows a side view of the boring head of FIG. 1, a part of which is centrally cut out.

For measuring the actual radial displacement of the tool carrier 10, a measuring area 15 is provided on the tool carrier 10, as can be seen in FIG. 3. The measuring area 15 is arranged directly adjacent a stationary sensor 16 which is adapted to measure radial displacements of the measuring area 15 relative to the sensor 16. The sensor 16 can for example be a hall-sensor or Anisotropic Magneto Resistor and the measuring area 15 a permanent magnet.

The sensor 16 is electrically connected to the PCB 60 of the electronic unit 20, such that a signal reflecting the actual displacement of the tool carrier 10 can be transferred to the PCB 60. The PCB 60 comprises contact elements or surfaces on its backside for contacting respective contact elements being connected to the sensor 16.

As can be seen in FIGS. 4 to 7, the electronic unit 20 as a whole has an essentially cuboid outer shape that fits into recess 5 of the head portion 4. The outer shape of the electronic unit 20 is mainly defined by an electronic casing 21 which as a whole is made from a metal and in one piece. The electronic casing 21 has an inner space in which the display 30 and the battery compartment 26 are arranged completely. This inner space is delimited by the electronic casing 21 as well as by the PCB 60 which forms the backside of the electronic unit 20. Thus, as a whole, the electronic unit 20 has a compact construction.

The electronic casing 21 forms a circumferential, essentially rectangular lateral frame which laterally delimits the electronic unit 20 and its electronic components with respect to the side walls of the recess 5. The inner space of the electronic casing 21 is divided into two compartments, a first compartment for accommodating the display 30 and a second compartment for accommodating the battery 41. Both compartments of the inner space are laterally delimited in all directions by the electronic casing 21 and are delimited backwards by the PCB 60. Towards the front, the first compartment of the inner space is delimited by a transparent display cover glass 31 which is inserted into a rectangular display window 25 formed by the electronic casing 21 (see FIGS. 4 and 7). The second compartment of the inner space is delimited towards the front by a removable battery cover 28 (FIG. 3), such that the battery compartment 26 is arranged between the battery cover 28 and the PCB 60.

Figure 4:
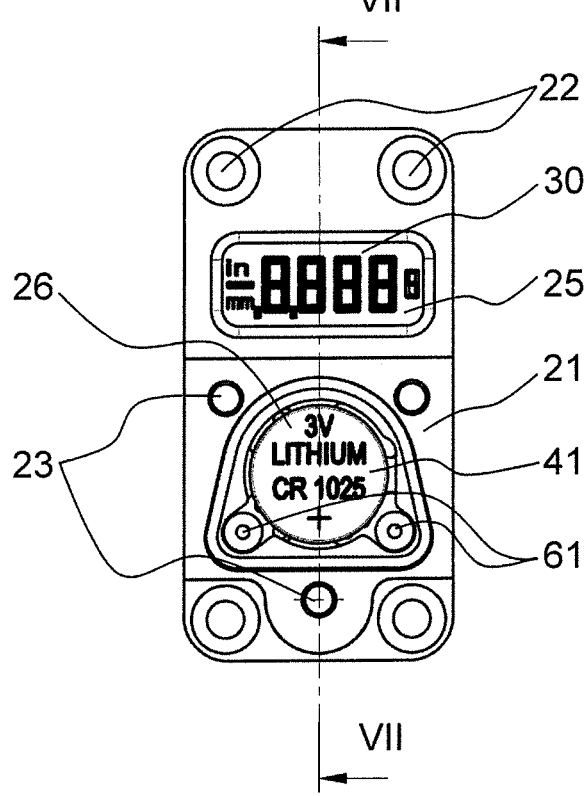
FIG. 4 shows a plan view on the front of the electronic unit of the boring head of FIG. 1, without battery cover.
Figure 5:
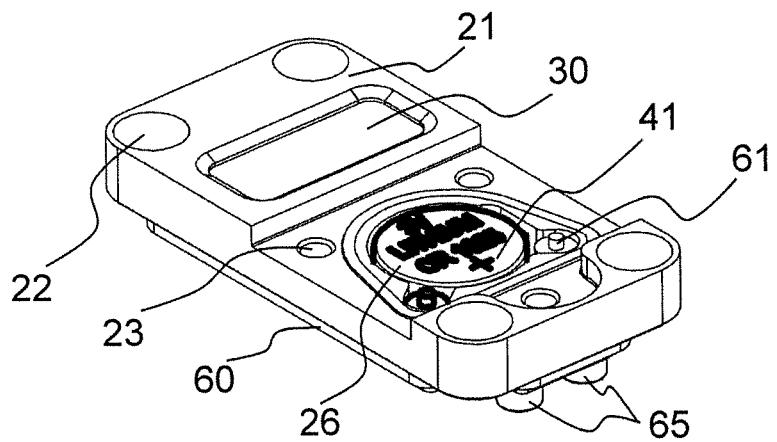
FIG. 5 shows a perspective front view of the electronic unit of the boring head of FIG. 1, without battery cover.
Figure 6:
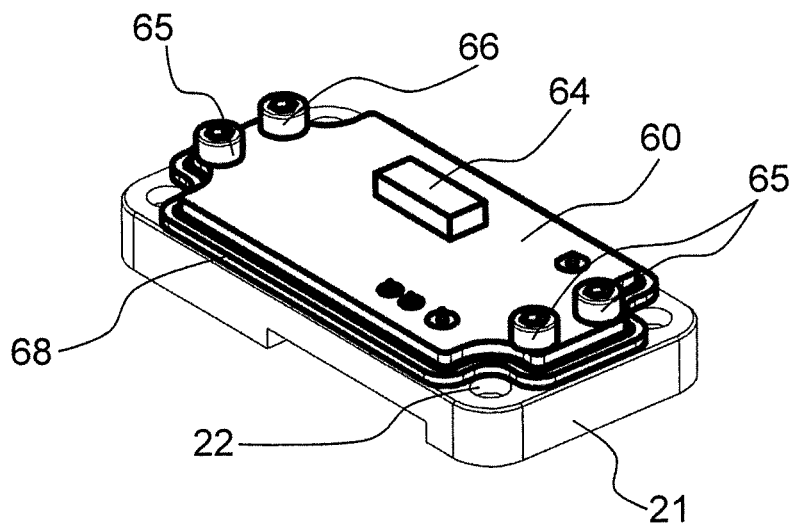
FIG. 6 shows a perspective back view of the electronic unit of the boring head of FIG. 1, without battery cover.

For attaching the electronic unit 20 to the head portion 4 of the boring head 1, a screw hole 22 is provided in each corner of the electronic casing 21, as can be seen in FIGS. 4 to 6. The PCB 60 comprises corresponding cut-outs in each of its corners (FIG. 6). For fixing the electronic unit 20 on the main body 2 of the boring head 1, fixing screws 24 (FIG. 1) are guided through the screw holes 22 and screwed into respective threaded holes which are correspondingly provided on the main body 2 for this purpose. Thus, the electronic unit 20 forms a compact subassembly of the boring head 1 that can be produced completely separately from the rest of the boring head 1. After its production, the electronic unit 20 as a whole can simply be screwed to the main body 2 by means of the fixing screws 24.

In order to achieve an overall essentially flat front surface of the completely assembled electronic unit 20, the electronic casing 21 comprises an indentation in its front surface in the area of the battery compartment 26 for accommodating the battery cover 28. The indentation is dimensioned such, that it is laterally completely filled out by the battery cover 28 and that the front face of the battery cover 28 comes to lie flush with the adjacent front face of the electronic casing 21. Threaded holes 23 are provided on the electronic casing 20 for fixing the battery cover 28 on the electronic casing 20 by means of fixing screws 48.

Figure 8:
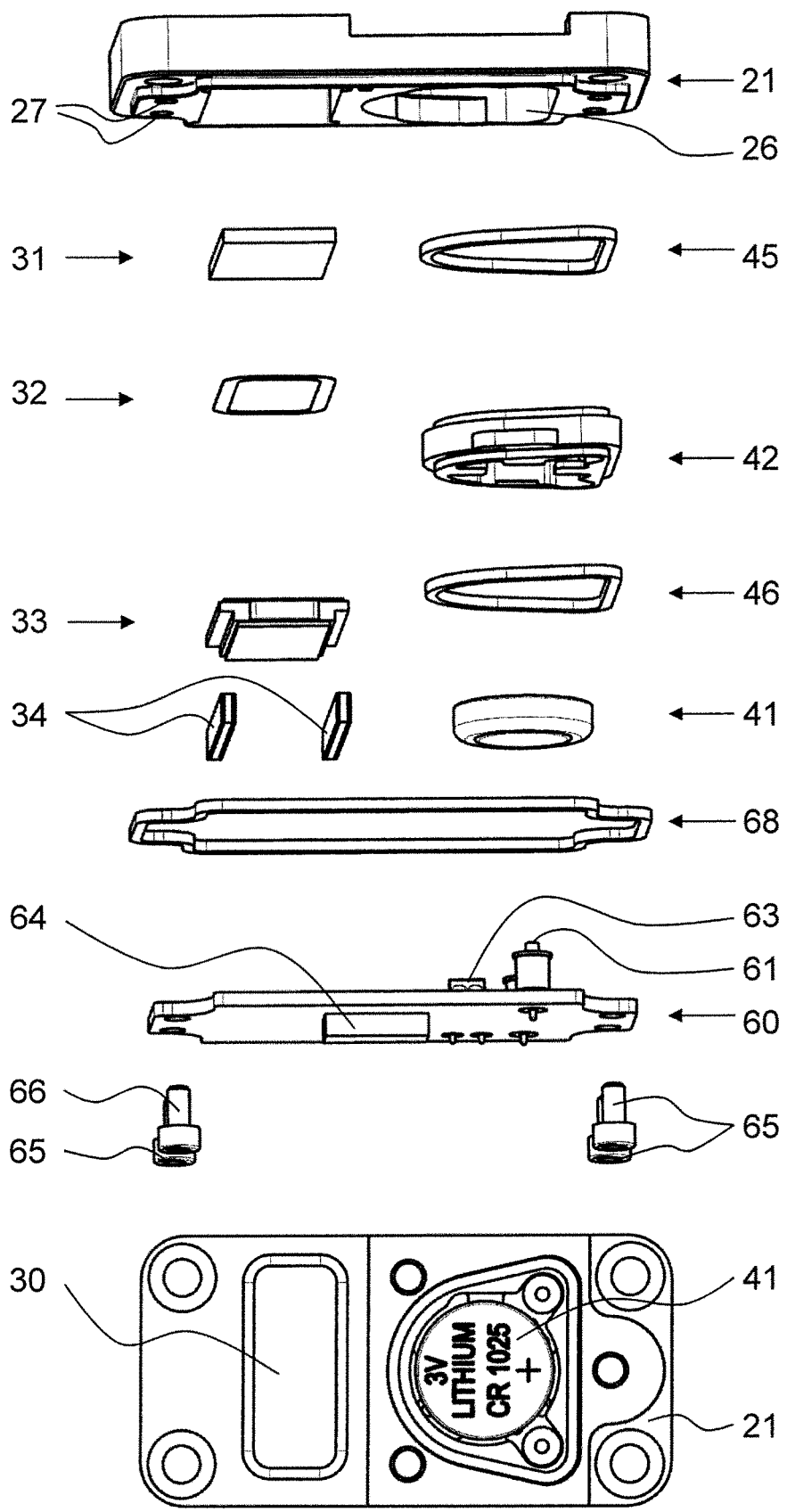
FIG. 8 shows a perspective exploded view of the of the electronic unit of the boring head of FIG. 1, without battery cover.

The display 30, the construction of which can be seen in FIG. 8, comprises the display cover glass 31, a separating foil 32, a liquid crystal display (LCD) 33 and two zebra strip connectors 34.

The display cover glass 31 is arranged in the display window 25 of the electronic casing 21 and serves to protect the LCD 33 from external mechanical influences, dirt particles and moisture. The separating foil is arranged between the display cover glass 31 and the LCD 33.

The LCD 33 serves to indicate the radial displacement of the tool carrier 10 and thus of the cutting insert 14 to the user. For this purpose, the LCD 33 is electrically connected by means of the zebra strip connectors 34 to an array of connector surfaces provided on the PCB 60. The zebra strip connectors 34 at the same time serve as spacers for arranging the LCD 33 close to the display cover glass 31 and to the display window 25.

On the PCB 60, which forms a control unit of the electronic unit 20, various electronic components 64 are arranged which are mutually interconnected by corresponding conductor tracks. The electronic components 64 of the PCB 60 usually encompass an analog-digital converter for converting the input signals received from the sensor 16 into digital data as well as a signal processing unit for processing the digital data and for providing a corresponding input signal to the LCD 33. The PCB 60 can also comprise a memory chip for storing the measured displacement data. The electronic components 64 are preferably arranged on the backside of the PCB 60.

On the front side of the PCB 60, contact elements 62 and 63 for contacting the battery 41 are provided bottom battery contacts 62 for contacting a first pole of the battery 41 and a lateral battery contact 63 for contacting a second pole of the battery 41 which here has the form of a button battery, in particular a CR 1025 lithium battery.

Further contact elements 61 are provided on the front side of the PCB 60, which serve to contact the push-button 49. Due to the integration of the push-button 49 in the removable battery cover 28 which is explained in detail below, the contact elements 61 are constructed as spring contacts.

For fixing the PCB 60 on the electronic casing 21 by means of three fixing screws 65 and an antenna connecting screw 66 (the further function of which will be explained later), the PCB comprises screw holes 69 which correspond to threaded holes 27 being provided on the backside of the electronic casing 21. A main sealing 68 is arranged between the electronic casing 21 and the PCB 60, in order to protect the inside of the electronic unit 20 and of the boring head 1 from the entering of dirt particles and of moisture.

Figure 7:
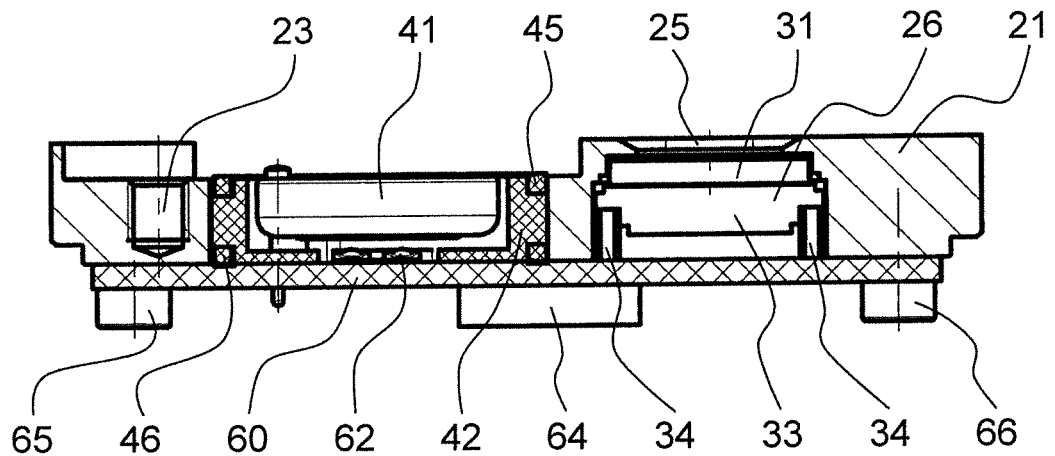
FIG. 7 shows a cross-sectional perspective back view of the electronic unit of the boring head of FIG. 1 along the line VII-VII as depicted in FIG. 4, without battery cover.

The second compartment of the inner space of the electronic unit 20 comprises the battery compartment 26 for accommodating a button battery 41. As can be seen in FIGS. 7 and 8, a battery casing 42 is arranged within the second compartment. The battery casing 42 is made from a non-conducting material, such as a plastic, and delimits the battery compartment 26 laterally and at least partly towards its backside. A lower battery sealing 46 is provided for sealing the battery casing 42 against the PCB 60 and the electronic casing 21, and an upper battery sealing 45 is provided for sealing the battery casing 42 against the battery cover 28 and the battery casing 42.

The battery casing 42 comprises an opening on its backside, such that the bottom battery contacts 62 and the lateral battery contact 63 can protrude into the battery compartment 26 for contacting the battery 41.

The construction of the battery cover 28 which also forms a push-button 49 is shown in FIGS. 9 to 16. The battery cover 28 comprises a cover plate 40 which is made as a whole in one piece and from a metal. This cover plate 40 has a substantially flat configuration with a central elevation that forms the push-button 49 on its front side.

Three screw holes 47 are provided in the cover plate 40 of the battery cover 28. The screw holes 47 serve to removably fix the battery cover 28 on the electronic casing 21 by means of fixing screws 48.

Figure 16:
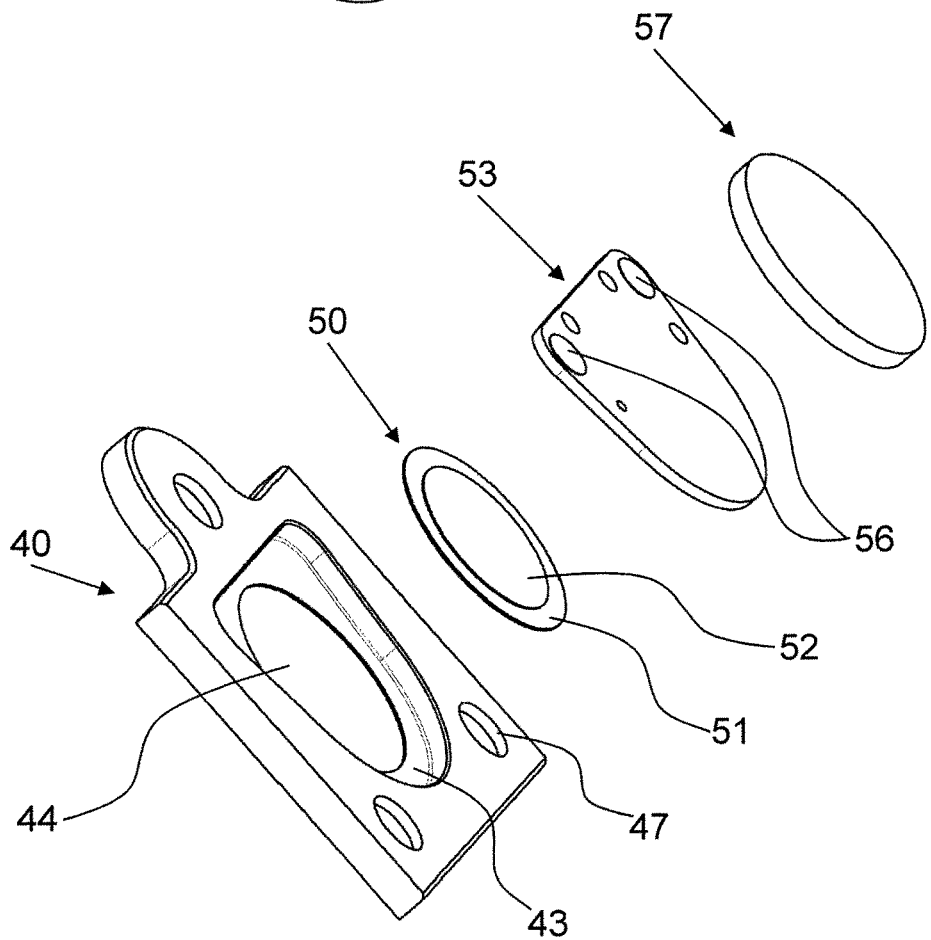
FIG. 16 shows an exploded perspective back view of the battery cover of the electronic unit of the boring head of FIG. 1.

On its backside, the cover plate 40 comprises an indentation 43 within which a further indentation 44 is present (see FIG. 16). The indentations 43 and 44 serve to accommodate a piezo diaphragm 50, a piezo board 53 and a battery spacer 57. The indentation 43 corresponds in shape and size to the piezo board 53 and is adapted to accommodate the piezo board 53. The indentation 44 corresponds in its circular shape and size to the piezo diaphragm 50 and serves to accommodate the piezo diaphragm 50. The piezo diaphragm 50 and the piezo board 53 represent the electronic components of the push-button, which are arranged between the battery compartment 26 and the cover plate 40.

The piezo diaphragm 50 has a construction as it is well known to the skilled person with a metal disc 51 and a ceramic substrate 52 applied to the backside of the metal disc 51. The metal disc 51 is a circularly shaped foil having approximately the same thickness as the depth of the indentation 44. The ceramic substrate 52 is applied as a circular surface coating concentrically to the metal disc 51. A small bending or deformation of the piezo diaphragm 50, in particular caused by a touch force load acting on the push-button 49, results in a variation of the electric voltage measured between the metal dish 51 and the ceramic substrate 52. The PCB 60 is adapted to detect such a variation of the electric voltage of the piezo diaphragm 50.

The electric connection of the metal disc 51 and of the ceramic substrate 52 to the contact elements 61 of the PCB 60 is achieved via the piezo board 53. For this purpose, the piezo board 53 which is designed as a printed circuit board comprises on its front side an annular contact surface 54 for contacting the periphery of the metal disc 51 and a central contact surface 55 for contacting the ceramic substrate 52. The annular contact surface 54 and the central contact surface 55 are each connected within the piezo board 53 to a respective contact surface 56 arranged on the backside of the piezo board 53. When the battery cover 28 is properly attached to the electronic casing 21, the contact surfaces 56 are each in contact with one of the contact elements 61 of the PCB 60, in order to transmit electric signals from the piezo diaphragm 50 to the PCB 60.

The battery spacer 57 is attached, for example by means of an adhesive, to the backside of the piezo board 53. The battery spacer 57 is made from a non-conductive plastic material and prevents the battery 41 from contacting the piezo board 53.

Figure 13:
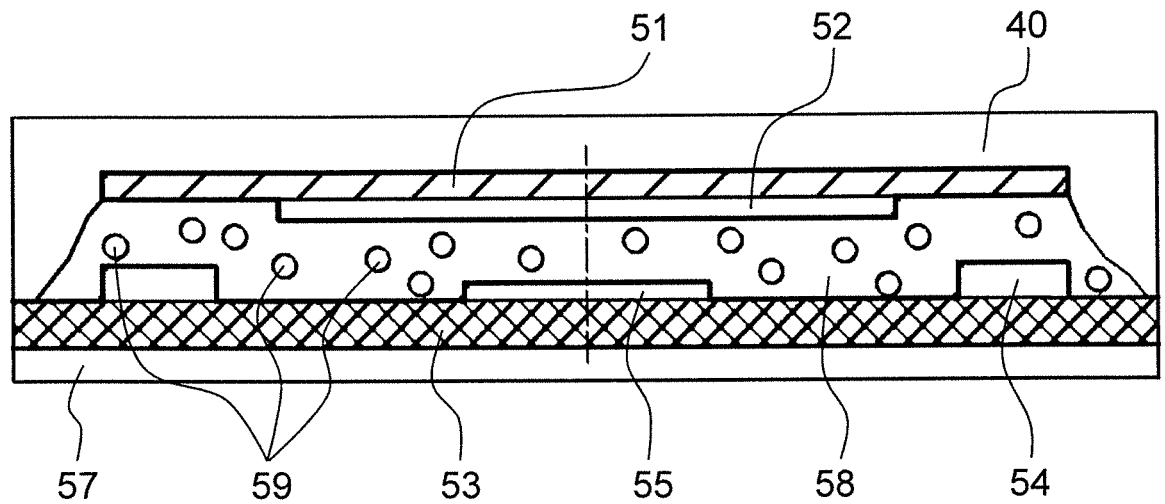
FIG. 13 shows an enlarged view of the area marked with dashed lines in FIG. 12, during production of the battery cover before being pressed.
Figure 14:
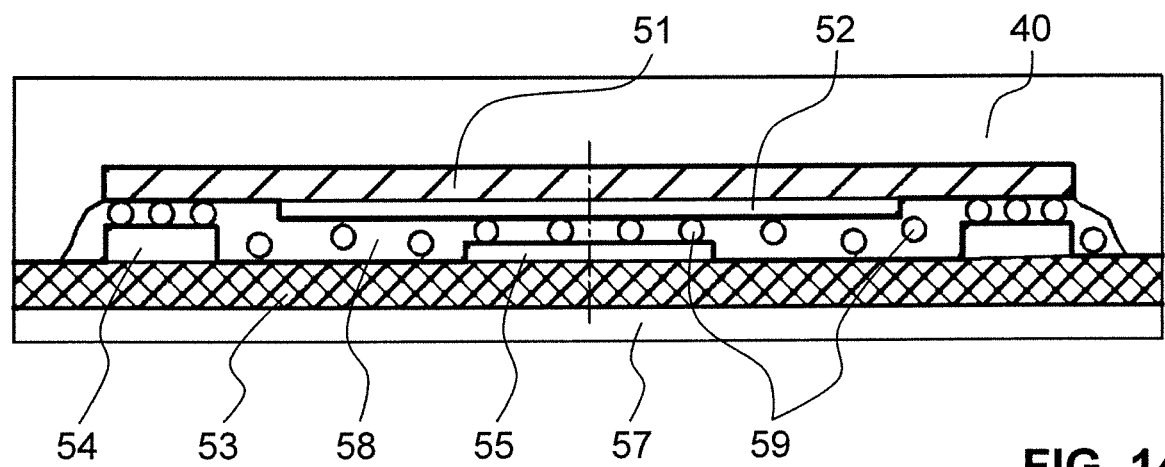
FIG. 14 shows an enlarged view of the area marked with dashed lines in FIG. 12, during production of the battery cover after being pressed.
Figure 15:
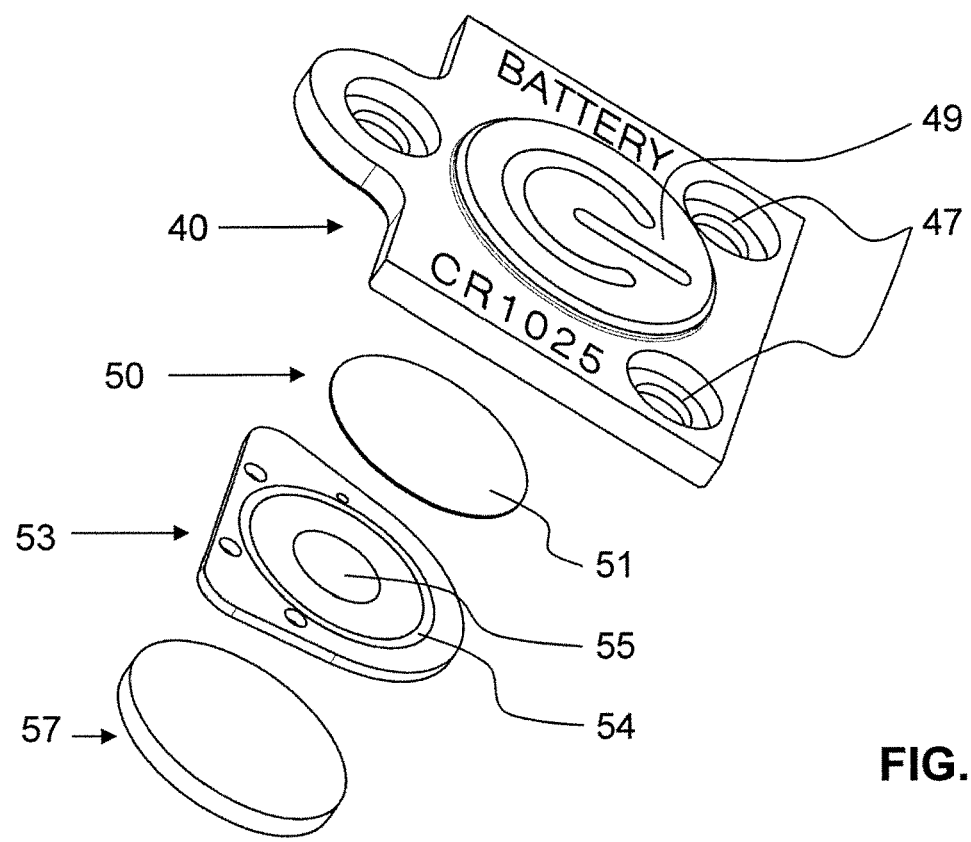
FIG. 15 shows an exploded perspective front view of the battery cover of the electronic unit of the boring head of FIG. 1.

A crucial step in the production process of the battery cover 28 is illustrated in FIGS. 13 and 14. It is illustrated how the piezo board 53 is attached to the piezo diaphragm 50 and the cover plate 40 by means of an anisotropic conductive adhesive 58: The anisotropic conductive adhesive 58 is applied to either the backsides of the piezo diaphragm 50 and the cover plate 40 or to the front side of the piezo board 53. The respective components are then brought together as intended, such that the anisotropic conductive adhesive 58 is in contact with each of the piezo board 53, the piezo diaphragm 50 and the cover plate 40. Electrically conductive particles 59 which are embedded in the anisotropic conductive adhesive 58 are arranged distant from each other and none of the conductive particles 59 is in contact with both the piezo board 53 and the piezo diaphragm 50. As a result, the anisotropic conductive adhesive 58 is non-conducting along all directions.

The battery cover 28 is then pressed in such a direction that the cover plate 40 and the piezo board 53 are moved closer each other (FIG. 14). The pressing can optionally be carried out under the influence of a temperature of typically 180-200° C. (thermocompressing). Thereby, the conductive particles 59 are moved together, such that electrically conductive bridges are formed by the conductive particles 59 that reach from the metal disc 51 and from the ceramic substrate 52 of the piezo diaphragm 50 to the respective contact surfaces 54 and 55 of the piezo board 53. The piezo diaphragm 50 and the piezo board 53 can even be moved so close to each together, that single conductive particles 59 get into contact with both the piezo diaphragm 50 and the piezo board 53, as shown in FIG. 14. Thus, in this pressed final position of the battery cover 28, an electric contact is established by the anisotropic conductive adhesive 58 between the metal disc 51 of the piezo diaphragm 50 and the annular contact surface 54 of the piezo board 53 on the one hand and between the ceramic substrate 52 of the piezo diaphragm 50 and the central contact surface 55 of the piezo board 53 on the other hand. However, the anisotropic conductive adhesive 58 is still non-conductive along the directions perpendicular thereto.

By using the anisotropic conductive adhesive 58 for attaching the piezo diaphragm 50 to the piezo board 53, a particularly safe and space-saving mechanical and electrical connection between these two components can be achieved.

The function of the push-button 49 in the present embodiment is programmed such in the PCB 60 that the electronic unit 20 and particularly the display 30 is switched on upon a first touch of the push-button 49 and that the indication of the radial displacement on the display 30 is reset to a zero-value upon a second touch of the push-button 49 that lasts longer than for one second.

The boring head 1 according to the present embodiment is adapted to wirelessly transmit data signals from the electronic unit 20 to an external device, such as a computer, a mobile phone or an adjuster tool for adjusting the adjusting screw 13. Thus, the data of radial displacement of the cutting insert 14 can not only be displayed on the display 30, but also on an external device.

Figure 17:
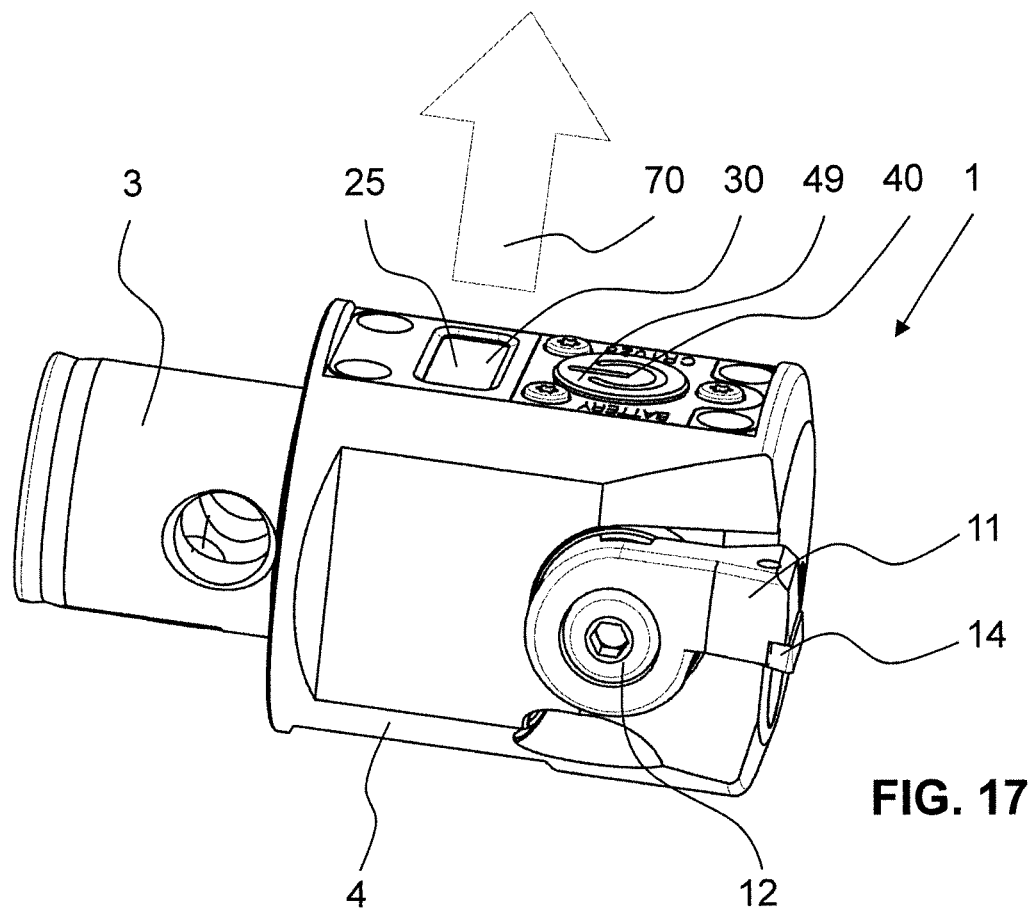
FIG. 17 shows a perspective view of the boring head of FIG. 1 when wirelessly transmitting data by means of an integrated antenna.
Figure 18:
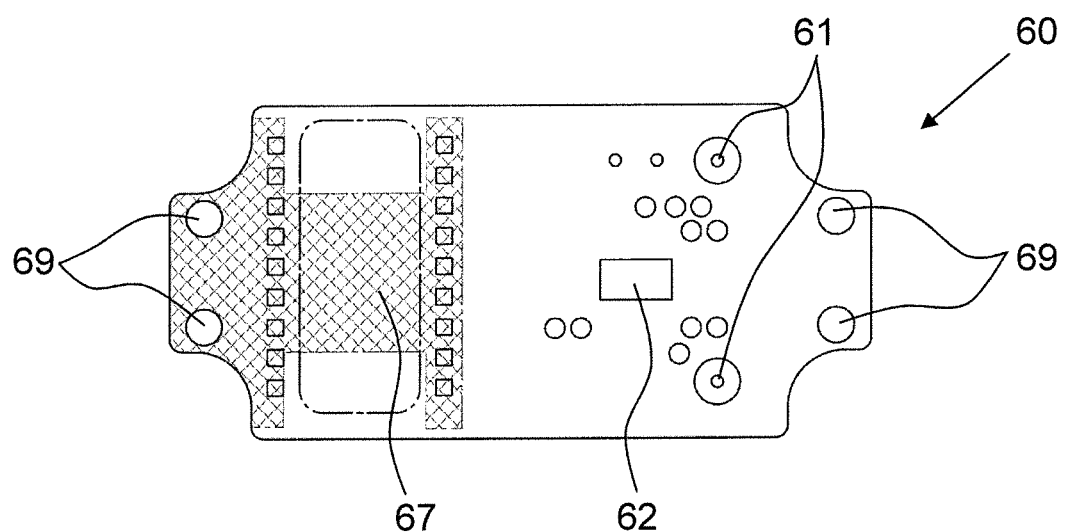
FIG. 18 shows a plan view on the front of the PCB of the electronic unit of the boring head of FIG. 1.

FIGS. 17 and 18 illustrate the adaptation of the boring head 1 to wirelessly transmit data signals to an external device. For this purpose, the boring head 1 comprises a transmission unit with an antenna that is adapted to send out electromagnetic waves. In the present embodiment, the transmission unit is adapted to wirelessly communicate with an external device according to the "Bluetooth Low Energy"-standard. Of course, other wireless communication standards could also be applied and the boring head 1 and in particular the transmission unit would be adapted accordingly in this case.

The transmission unit also comprises a Bluetooth-microcontroller arranged in the PCB 60 for generating the 2.4 GHz Bluetooth signal as well as a matching circuit with a series of inductors and capacitors for adapting the impedance form the antenna to the one of the Bluetooth-microcontroller to the same 500 impedance in both directions, in order to minimize energy losses.

As shown in FIG. 17, the display window 25 is used for sending out the electromagnetic antenna radiation 70 from the electronic unit 20 to an external device. Thus, the antenna radiation 70 is transmitted through the display window 25 to the outside of the boring head 1.

In the present embodiment, the antenna for the wireless data transmission is formed by an internal radiofrequency (RF) ground plane 67 integrated in the PCB 60 in the area behind the display window 25 (see FIG. 18), by the antenna connecting screw 66 and by the electronic casing 21. The metallic and thus conducting electronic casing 21 represents the conducting element of the antenna exposed in space. The ground plane 67 and the conductive element, i.e. the electronic casing 21, form the two legs of the antenna. The antenna connecting screw 66 serves as a connection element between the PCB 60 and the conducting element, i.e. the electronic casing 21. Accordingly, the antenna connection screw 66 is made from an electrically conducting material, i.e. a metal such as aluminium, while the fixing screws 65 can be made from any material and also from less or non-conducting materials, such as a plastics material or titanium. For connecting the antenna connection screw 66 to an antenna feed on the PCB 60, the PCB 60 comprises a contact surface surrounding the corresponding screw hole 69. In the present embodiment, the ground plane 67 is designed as a rectangular area that covers a major part of the backside of the display window 25.

The invention is of course not limited to the preceding presented embodiment and a plurality of modifications is possible. For example, the antenna for wirelessly transmitting data to an external device could be designed as a ceramic antenna behind the display window 25, a microstrip-antenna behind the display window 25, in particular on the PCB 60, a patch-antenna behind the display window 25 or as a slot antenna arranged within the display window 25. The push-button 49 does not necessarily be integrated in the battery cover 28, but could also be provided separately from the battery cover. Instead of using a piezo-element, the button could be a provided as any other button according to the state of the art. In an alternative embodiment, the stem portion 3 could also be cone-shaped or have a polygonal cross-section. Furthermore, the function of the sensor 16 and the measuring area 15 for measuring radial displacements of the tool carrier 10 could alternatively also be based on an optical, capacitive or inductive measurement. Instead of wirelessly communicating according to a "Bluetooth"-standard, the transmission unit could also be adapted to communicate according to ANT, ZigBee or any other standard. A plurality of further modifications is possible.

The invention claimed is:

1. A boring head with an electronic unit integrated in the boring head, the electronic unit comprising:
    a control unit,
    a display being connected to the control unit, for displaying information concerning the status of the boring head to a user, and
    a compartment for a power source to supply the control unit and the display with electric power, and
    at least one button being operatively connected to the control unit, in order to enable the user to influence the control unit,
    wherein the electronic unit as a whole is designed as a compact subassembly of the boring head, and
    wherein the button covers the compartment for the power source.

2. The boring head as claimed in claim 1, wherein the compartment for the power source is arranged between the control unit and the button.

3. The boring head as claimed in claim 1, wherein the electronic unit further comprises a piezo element, in order to detect a manipulation of the button by the user.

4. The boring head as claimed in claim 3, wherein the piezo element is formed as a piezo diaphragm, and wherein the piezo diaphragm is connected to the control unit by means of an anisotropic conductive adhesive.

5. The boring head as claimed in claim 4, wherein the electronic unit further comprises a piezo board to which the piezo diaphragm is connected by means of the anisotropic conductive adhesive, and wherein the piezo board is arranged between the compartment for the power source and the piezo element.

6. The boring head as claimed in claim 1, further comprising a radially displaceable insert holder and a sensor for measuring the radial displacement of the insert holder, the sensor being connected to the control unit, and the control unit being adapted to control the display such that the radial displacement is indicated by the display.

7. The boring head as claimed in claim 1, wherein the electronic unit comprises a casing in or on which the control unit, the display, the compartment for the power source, and a button operatively connected to the control unit, are arranged.

8. The boring head as claimed in claim 7, wherein the PCB and the casing together form an inner space of the electronic unit, the display and the compartment for the power source being completely disposed in the inner space.

9. The boring head as claimed in claim 1, wherein a printed circuit board (PCB) is provided as the control unit.

10. The boring head as claimed in claim 9, wherein the PCB forms a backside of the electronic unit.

11. The boring head as claimed in claim 1, wherein the electronic unit further comprises an antenna for wirelesssly transmitting data from the control unit to an external device.

12. The boring head as claimed in claim 1, wherein the boring head comprises a main body with a recess, and wherein the electronic unit is arranged within the recess.

* * * * *